United States Patent
Hogbin

(10) Patent No.: US 11,899,838 B2
(45) Date of Patent: Feb. 13, 2024

(54) HAND WORN INTERFACE DEVICE INTEGREATING ELECTRONIC SENSORS

(71) Applicant: Plexus Immersive Corp, San Francisco, CA (US)

(72) Inventor: Matthew Hogbin, San Francisco, CA (US)

(73) Assignee: Plexus Immersive Corp, San Francisco, CA (US)

( * ) Notice: Subject to any disclaimer, the term of this patent is extended or adjusted under 35 U.S.C. 154(b) by 0 days.

(21) Appl. No.: 16/631,831

(22) PCT Filed: Jul. 19, 2018

(86) PCT No.: PCT/US2018/042975
§ 371 (c)(1),
(2) Date: Jan. 16, 2020

(87) PCT Pub. No.: WO2019/018702
PCT Pub. Date: Jan. 24, 2019

(65) Prior Publication Data
US 2020/0150761 A1 May 14, 2020

Related U.S. Application Data

(60) Provisional application No. 62/534,413, filed on Jul. 19, 2017, provisional application No. 62/535,991, filed on Jul. 24, 2017.

(51) Int. Cl.
*G06F 3/01* (2006.01)
*G01R 27/26* (2006.01)
(Continued)

(52) U.S. Cl.
CPC ............ *G06F 3/014* (2013.01); *G01B 7/30* (2013.01); *G01R 27/2611* (2013.01); *G06F 3/016* (2013.01); *G06F 3/0346* (2013.01)

(58) Field of Classification Search
CPC ........ G06F 3/014; G06F 3/016; G06F 3/0346; G06F 3/017; G06F 1/163; G01R 27/2611; G01B 7/30
See application file for complete search history.

(56) References Cited

U.S. PATENT DOCUMENTS 4,302,138 A * 11/1981 Zarudiansky .............. B25J 3/04
414/5
5,930,741 A 7/1999 Kramer
(Continued)

FOREIGN PATENT DOCUMENTS

EP 3098691 A1 11/2016
JP 2016130940 A 7/2016

OTHER PUBLICATIONS

International Search Report in PCT Application No. PCT/US18/42975, dated Dec. 18, 2018.
(Continued)

*Primary Examiner* — Rodney Amadiz
(74) *Attorney, Agent, or Firm* — Cognition IP, P.C.; Edward Steakley

(57) ABSTRACT

A wearable device comprises a flexible substrate carrying multiple conducting loops which are formed into a zig zag pattern so as to be able to accommodate a stretching of the substrate. The substrate is formed into a glove and the loops positioned such that they are aligned with the anatomical joints. As the anatomical joints move, the loops change shape and accordingly change their inductance—this is measured by the electronics in the glove and used to calculate the joint angles in a processor which transmits the angles to an external computer system. Some of the loops are attached to current drivers in the electronics module, and a magnet positioned close to the loop, providing means for a force to be generated between magnet and loop when the
(Continued)

current driver passes current through the loop, thereby providing tactile feedback to the user.

17 Claims, 9 Drawing Sheets

(51) Int. Cl.
*G06F 3/0346* (2013.01)
*G01B 7/30* (2006.01)

(56) References Cited

U.S. PATENT DOCUMENTS

| | | | | |
|---|---|---|---|---|
| 5,986,643 | A * | 11/1999 | Harvill | G06F 3/011 341/27 |
| 6,126,373 | A | 10/2000 | Yee et al. | |
| 9,104,271 | B1 | 8/2015 | Adams et al. | |
| 9,529,433 | B2 | 12/2016 | Shankar et al. | |
| 10,137,362 | B2 | 11/2018 | Buchanan et al. | |
| 2001/0020140 | A1 | 9/2001 | Kramer | |
| 2007/0132722 | A1 * | 6/2007 | Kim | G06F 3/014 345/156 |
| 2009/0256558 | A1 * | 10/2009 | Fujita | G01B 7/105 324/230 |
| 2011/0202306 | A1 | 8/2011 | Eng et al. | |
| 2011/0260963 | A1 * | 10/2011 | Timmons | G06F 3/014 345/156 |
| 2012/0157263 | A1 | 6/2012 | Sivak et al. | |
| 2013/0131554 | A1 * | 5/2013 | Dunias | A61B 5/45 600/595 |
| 2014/0238153 | A1 | 8/2014 | Wood et al. | |
| 2016/0161301 | A1 | 1/2016 | Guenther et al. | |
| 2016/0070347 | A1 | 3/2016 | McMillen et al. | |
| 2016/0363997 | A1 | 12/2016 | Black et al. | |
| 2017/0168567 | A1 | 6/2017 | Reese et al. | |
| 2017/0176267 | A1 | 6/2017 | Keller et al. | |
| 2017/0303853 | A1 * | 10/2017 | McMillen | G01L 1/2206 |
| 2018/0307507 | A1 * | 10/2018 | Kim | G06F 3/0233 |
| 2020/0080832 | A1 * | 3/2020 | Lee | G06F 3/017 |
| 2020/0117271 | A1 * | 4/2020 | Bosworth | H04N 5/33 |
| 2020/0324402 | A1 * | 10/2020 | Roh | B25J 1/02 |

OTHER PUBLICATIONS

Onorio Iervolino et al. "Wearable Spiral Passive Electromagnetic Sensor (SPES) glove for sign language recognition of alphabet letters and Nos. a preliminary study," Proceedings vol. 10166, Industrial and Commercial Applications of Smart Structures Technologies, Apr. 4, 2017.

Nikola Jerance et al. "A Compact Inductive Position Sensor Made by Inkjet Printing Technology on a Flexible Substrate," Sensors 2012, 12, pp. 1288-1298.

Zhong Shen et al., "A soft stretchable bending sensor and data glove applications," Robotics and Biomimetics, (2016) 3:22.

A. V. Prituja et al., "Electromagnetically Enhanced Soft and Flexible Bend Sensor: A Quantitative Analysis With Different Cores," IEEE Sensors Journal, 2018.

* cited by examiner

HAND WORN INTERFACE DEVICE INTEGREATING ELECTRONIC SENSORS

CROSS-REFERENCE TO RELATED APPLICATIONS

This application is a 35 U.S.C. § 371 national stage application of PCT International Application No. PCT/US2018/042975, filed on Jul. 19, 2018, which claims the benefit of U.S. Provisional Application No. 62/534,413, filed on Jul. 19, 2017 and 62/535,991, filed on Jul. 24, 2017, all of which are hereby incorporated by reference in their entirety.

FIELD OF THE INVENTION

The present invention relates to computer human interface devices, and more specifically to interface devices can be worn on and which interface with parts of the human body such as the hand. Such devices are useful in interacting with computer programs, such as interacting three dimensional representations of objects or data, or in the context of virtual reality, and in capturing body motion for later replay.

BACKGROUND OF THE INVENTION

Some previous devices have used resistive flex sensors incorporating partially conductive elastomeric materials to measure the flexion of hand joints. These devices have the disadvantage that the value measured depends on the joint angle in a nonlinear way, and also upon previous joint angles, that is to say they display hysteresis. These devices have the further disadvantage that the value measured changes with temperature. These devices have the further disadvantage that they consist of several components—electrodes, active elastomeric medium, and a flexible substrate, as well as wires to carry signals to and from supporting circuitry, resulting in a relatively high overall cost.

Other previous devices have used optical fibres to measure the joint angles of the hand. These devices have the disadvantage that they require a light source, light transmission, and light detection, as well as analog amplification and analog to digital conversion circuitry, resulting in a high overall cost.

Other previous devices have used external optical means such as cameras to measure the joint angles of the hand, for instance devices available from Leap Motion. These devices have the disadvantage that they cannot always see every part of the hand, due to the blocking of one part of the hand by another in some poses and accordingly lose track of the position of the parts of the hand they cannot see. These devices also have the disadvantage that they cannot provide tactile feedback to the user as they are not in contact with the user's skin.

DRAWING DESCRIPTIONS

DETAILED DESCRIPTION OF EMBODIMENTS

Figure 1:
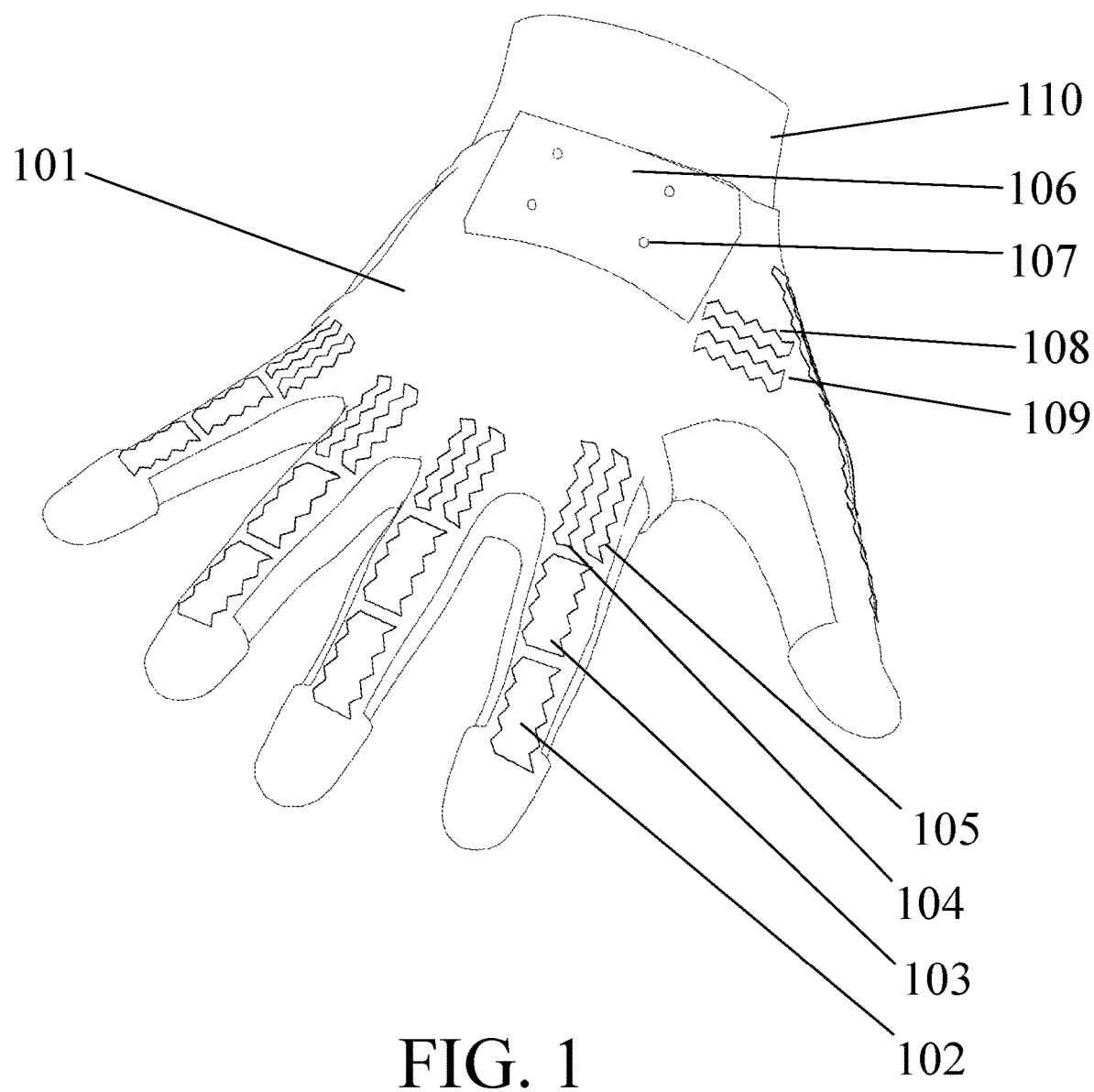
FIG. 1 shows the general layout of conductive loops within or upon a hand worn embodiment of the device and their placement with respect to the joints of the hand.
Figure 2:
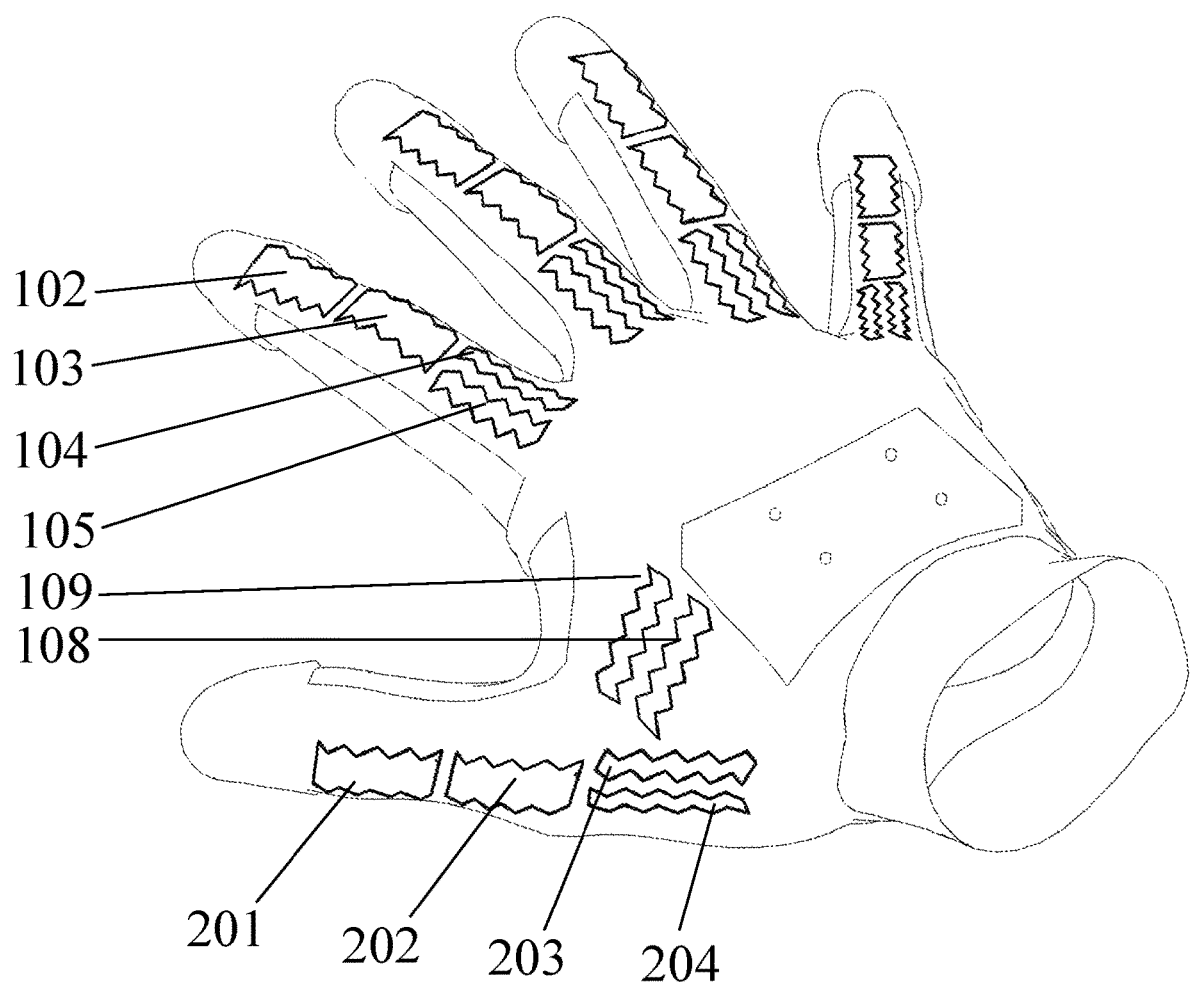
FIG. 2 shows a different view of the device, showing the placement of conductive loops around the joints of the thumb.
Figure 3:
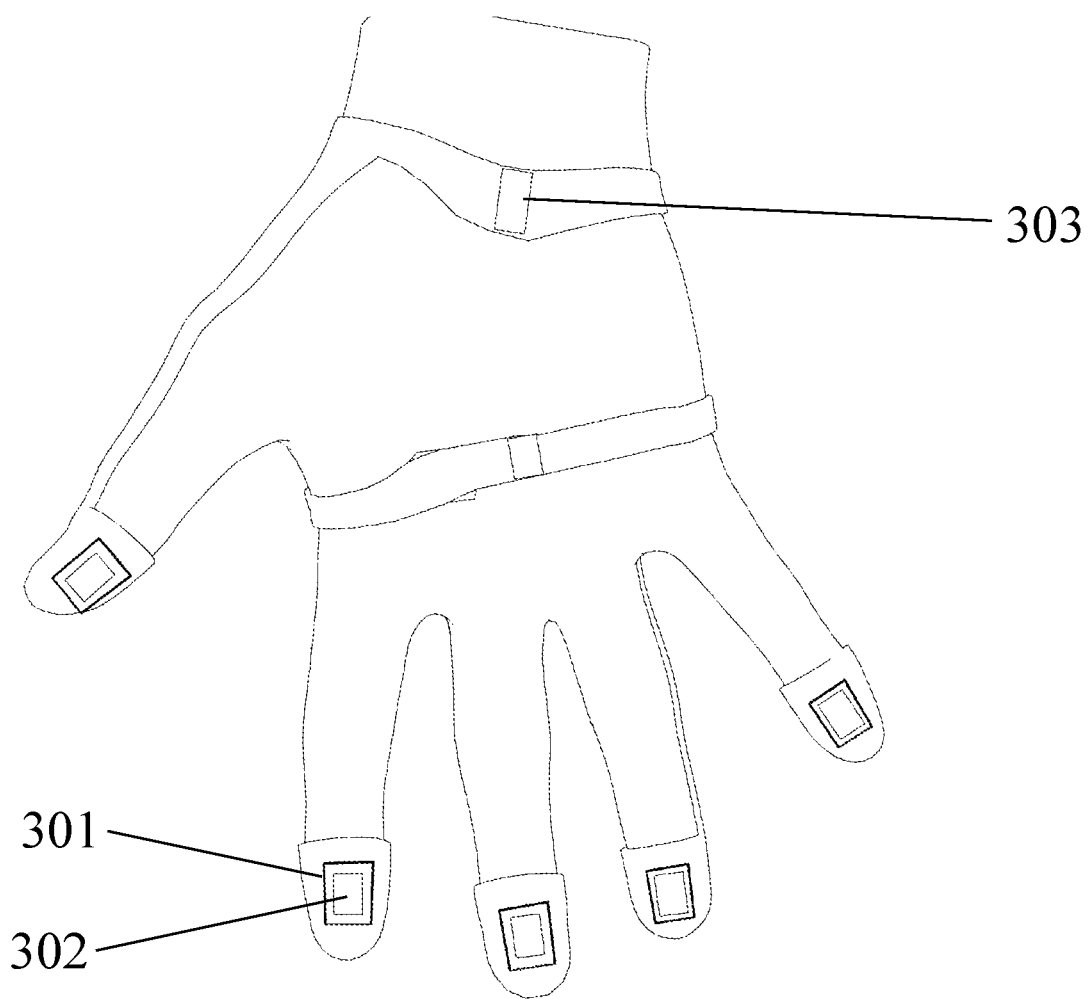
FIG. 3 shows a view from the palmar surface of the device.

One embodiment of the device is shown in FIG. 1 (overview), FIG. 2 (thenar view), and FIG. 3 (palmar view). This embodiment of the device is worn on the hand but other embodiments may be worn on other parts of the body. A flexible, elastic substrate 101 is worn on the user's hand 110. Said substrate 102 may be made from an elastomer such as silicone or polyurethane, or a woven elastic textile such as Lycra.

Conductive loops 102, 103, 104, 105, 108 and 109 are mounted upon, woven into or embedded within said substrate 102. The basic structure for each finger, formed by the set up loops 102, 103, 104, 105, may be taken as being repeated for each digit as shown in the figure. In addition to the same four loops as the other digits, the thumb is also provided with two additional loops 108 and 109.

In some embodiments of the device the conductive loops 102, 103, 104, 105, 108 and 109 are made of metal wire such as copper which is of a thickness that they can bend repeatedly without breaking. In some embodiments the thickness of the copper wire is typically 0.1 mm.

An electronics module 106, houses inductance measurement electronics, a processor, a wireless transmitter and a battery and is mounted onto the substrate 102. Contacts (exemplified by 107) are provided as means to connect the device to an external power source in order to charge it's internal battery.

Conductive loop 102 is positioned on top of the distal interphalangeal joint of the digit, and the measurement of it's inductance is used to calculate the angle of this joint.

Conductive loop 103 is positioned on top of the proximal interphalangeal joint of the digit.

Conductive loops 104 and 105 are positioned on top of the metacarpal phalangeal joint.

Each conductive loop 102, 103, 104, 105, 108, 109 consists of zigzag edges such that it can accomodate a stretching of the substrate. When one of the finger joints flexes, the associated conductive loop is stretched and the inductance is increased. Conversely when a joint extends the inductance is decreased. The electronics module 106 uses this inductance change to calculate the joint flexion.

When a digit adducts or adbucts at the metacarpal phalangeal joint, loops 104 and 105 are stretched or compressed. The electronics module 106 uses the difference in the change in the change in inductance of loops 104 and 105 to calculate the degree of adduction or abduction of the digit.

In the same way, when the thumb carpal metacarpal joint flexes, loops 108 and 109 change inductance due to the twisting and bending motion imparted to the substrate between the thumb and the back of the hand. For this reason loops 108 and 109 are mounted close to the upper surface of the substrate, above the neutral axis of the material, to maximise this response.

The thumb is provided with conductive loops 201, 202, 203 and 204 which correspond to finger loops 102, 103, 104 and 105 respectively. In some embodiments loop 202 is replaced by a loop pair 203, 204 in order to measure adduction and abduction of the thumb metacarpal phalangeal joint. Loops 203 and 204 measure the thumb carpal metacarpal joint in the same way as described for the measurement of the finger metacarpal phalangeal joint using loops 104 and 105.

Magnets 302 are placed on the each of the fingertips close to conductive loops 301. The electronics module 106 includes current drivers attached to the coil. The electronics module 106 can receive a command from an external computer to drive a current in the coil 301, producing a force on the magnet 302 and creating a tactile feedback effect on the user's skin. In other embodiments the structure comprised of 301 and 302 can be replicated at other points of the skin surface in order to provide more detailed tactile feedback effects.

Fasteners 303 for attaching the wearable device may be provided to allow sections of the wearable device to be split apart and joined together, in order to make it easier to put on and take off.

Figure 4:
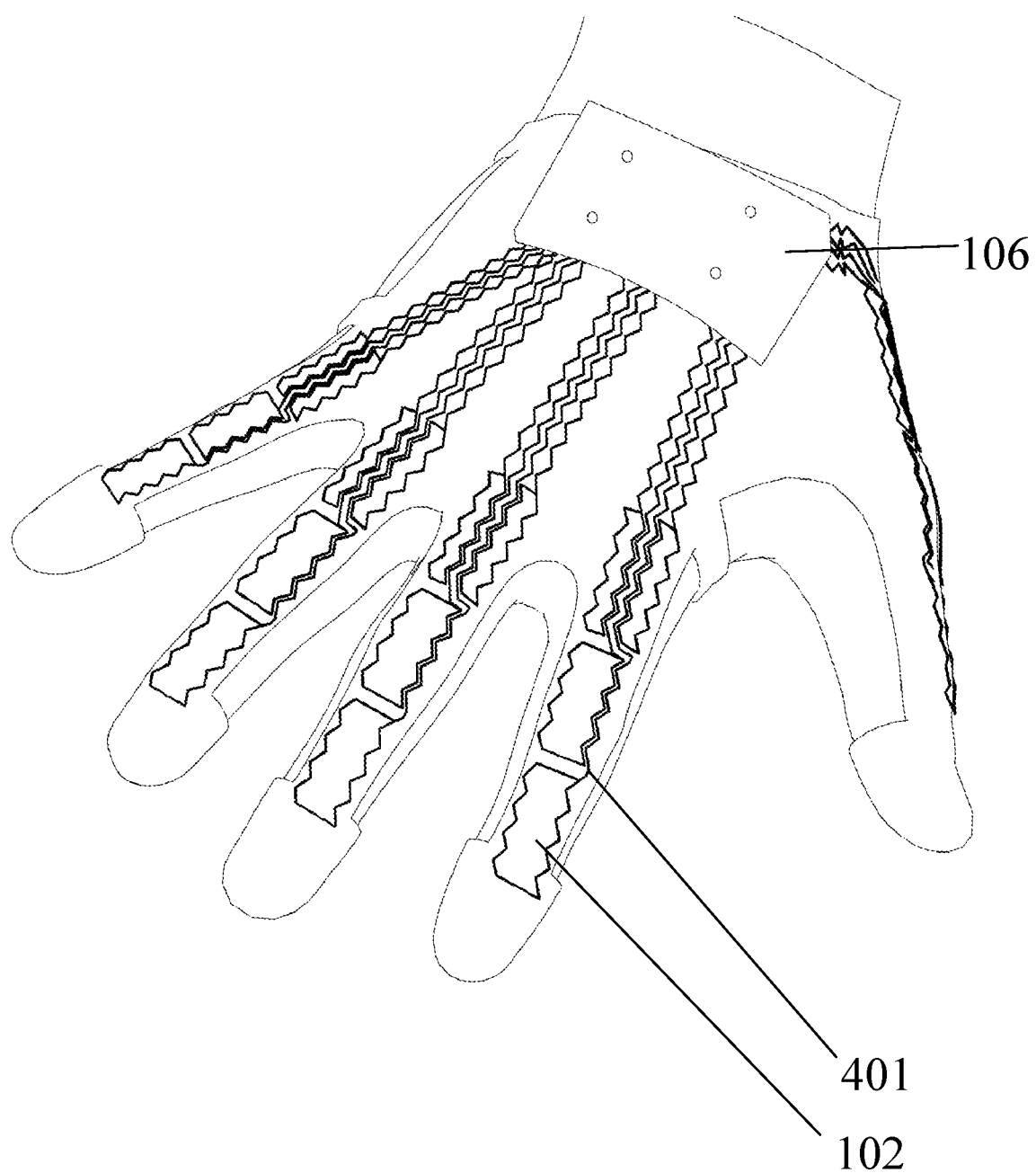
FIG. 4 shows the conductive wires connecting the conductive loops with the electronics module.

FIG. 4 shows the zig-zag connecting wire pair 401 connecting the loop 102 with the electronics module 106. The zig zag connecting wire pair is so shaped to accomodate stretch in the same way as the conductive coils 102 themselves. Every conducting coil discussed has a similar conducting wire pair connecting it to the electronics module 106.

In other embodiments the coils 102, 103, 104, 105, 108 and 109 and connecting wires 401 may have alternate patterns such as wavy arcs in alternate directions, rounded zig zags, rectangular side to side patterns, or helical structures in order to allow them to acommodate stretching of the underlying and embedding substrate material.

Figure 5:
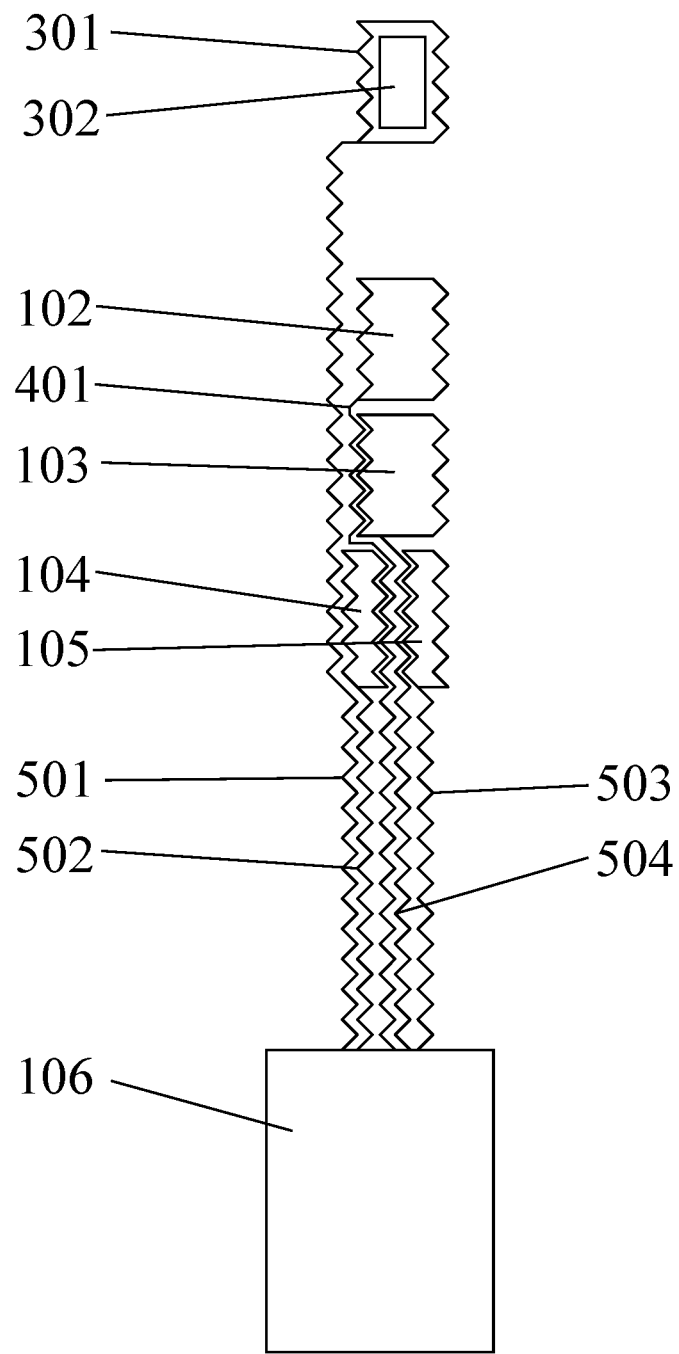
FIG. 5 shows the conductive loops and connecting wires that are associated with a single digit, connected to the electronics module.

FIG. 5 shows the detail of the layout of the coils for a single digit 102, 103, 104, 105 and 301 and their associated conducting wire pairs 501, 401, 504, 503 and 502 connecting each coil to the electronics module 106. This arrangement is repeated for each digit of the hand.

Figure 6:
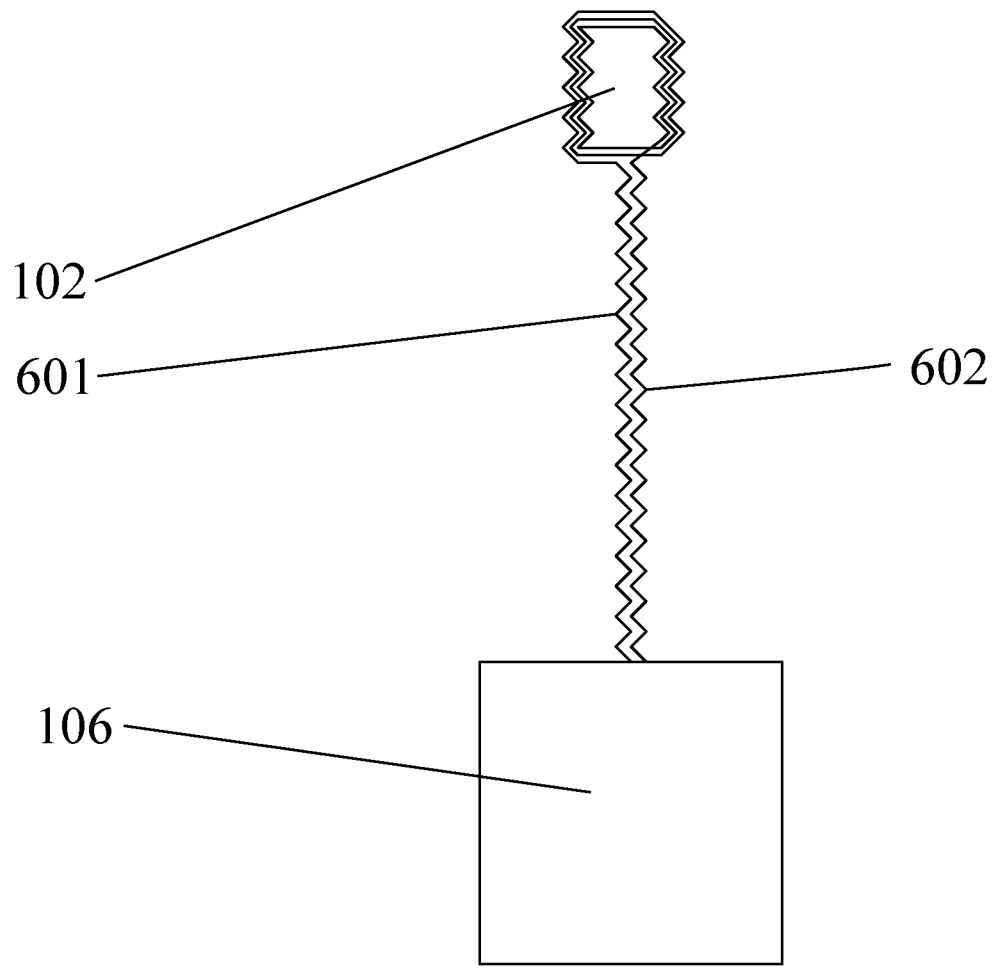
FIG. 6 shows a single conductive loop and it's associated connecting wires, connected to the elecronics module.

FIG. 6 shows a single coil in detail. Each coil discussed may consist of more than one turns of conductor. In one embodiment between three and five turns of inductor are used but other numbers of turns may be used without materially changing the invention. Each connecting wire pair 401 comprises a wire 601 and 602 such that the whole circuit runs in an unbroken circuit from the electronics module 106, down the wire 601, one or more times around the loop 102, and back down the wire 602 to the electronics module.

Figure 7:
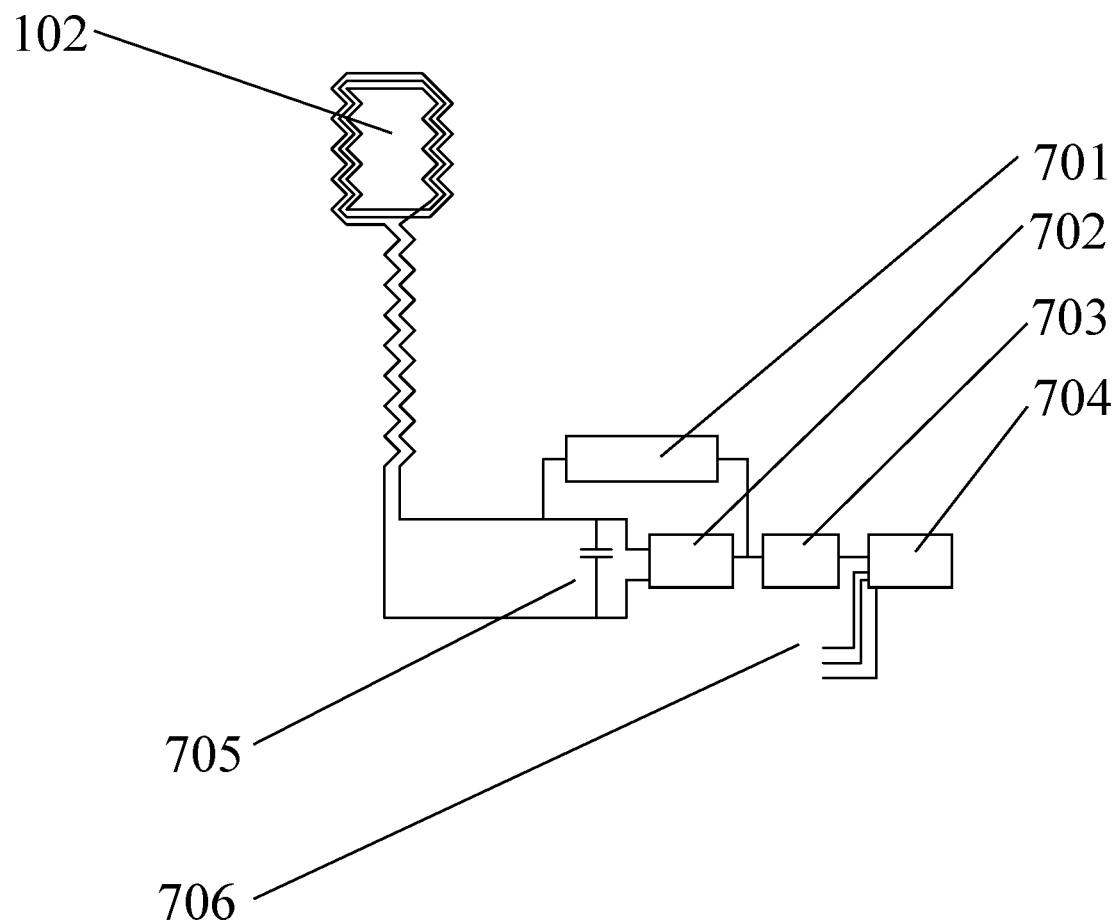
FIG. 7 shows the electronic circuit associated with each conductive loop.

FIG. 7 shows the detail of a coil 102 connected to the electronics module 106, which is comprised of a capacitor 705, an amplifier 702, a feedback loop 701, a frequency counter 703, and a processor/wireless transmitter 704. The processor 704 has inputs 706 which are connected to the frequency counters associated with all the other coils in the system which require measurement. The basic arrangement comprising 705, 702, 702, and 703 is repeated for each coil; only the circuit for coil 102 is shown here for clarity.

In some embodiments, the amplifier 702, feedback loop 701, and frequency counter 703 are implemented inside a field programmable gate array such as a Lattice ICE40LP1K integrated circuit. In other embodiments the amplifier 702, feedback loop 701 and frequency counter 703 may be provided by an inductance to digital converter. In other embodiments the amplifier may be provided by one or more transistors or amplifier integrated circuits without materially changing the invention.

The processor 704, which may be realised as a Nordic NRF52832 as well as other possible equivalent parts, includes a wireless transmitter, using for example the Bluetooth wireless transmission standard, which relays the measured joint angles to an external computer. In some embodiments a proprietary protocol such as Nordic Enhanced Shockburst may be used as an alternative without materially changing the invention.

Figure 8:
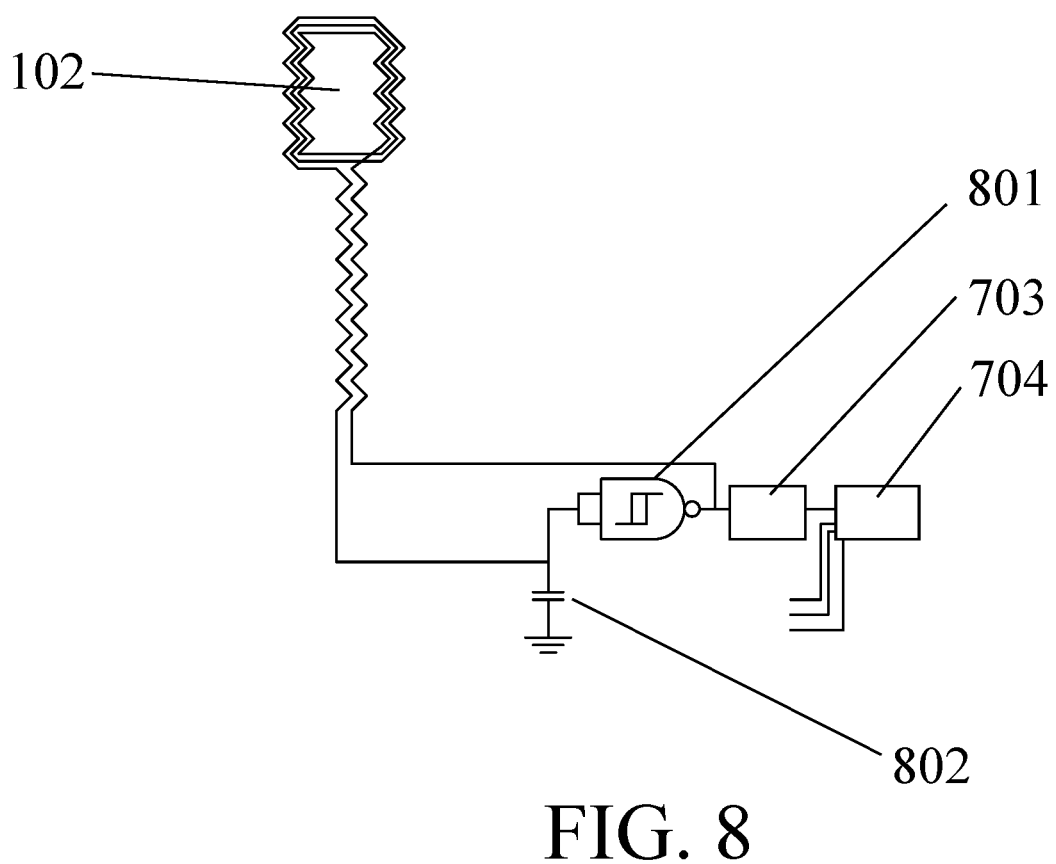
FIG. 8 shows one embodiment of the electronic circuit associated with each conductive loop.

FIG. 8 shows an alternative embodiment of the electronics module 106 wherein a 4093 NAND Schmidt trigger is used to create the oscillator, and a capacitor 802 is placed differently to the capacitor 705 of FIG. 7.

Figure 9:
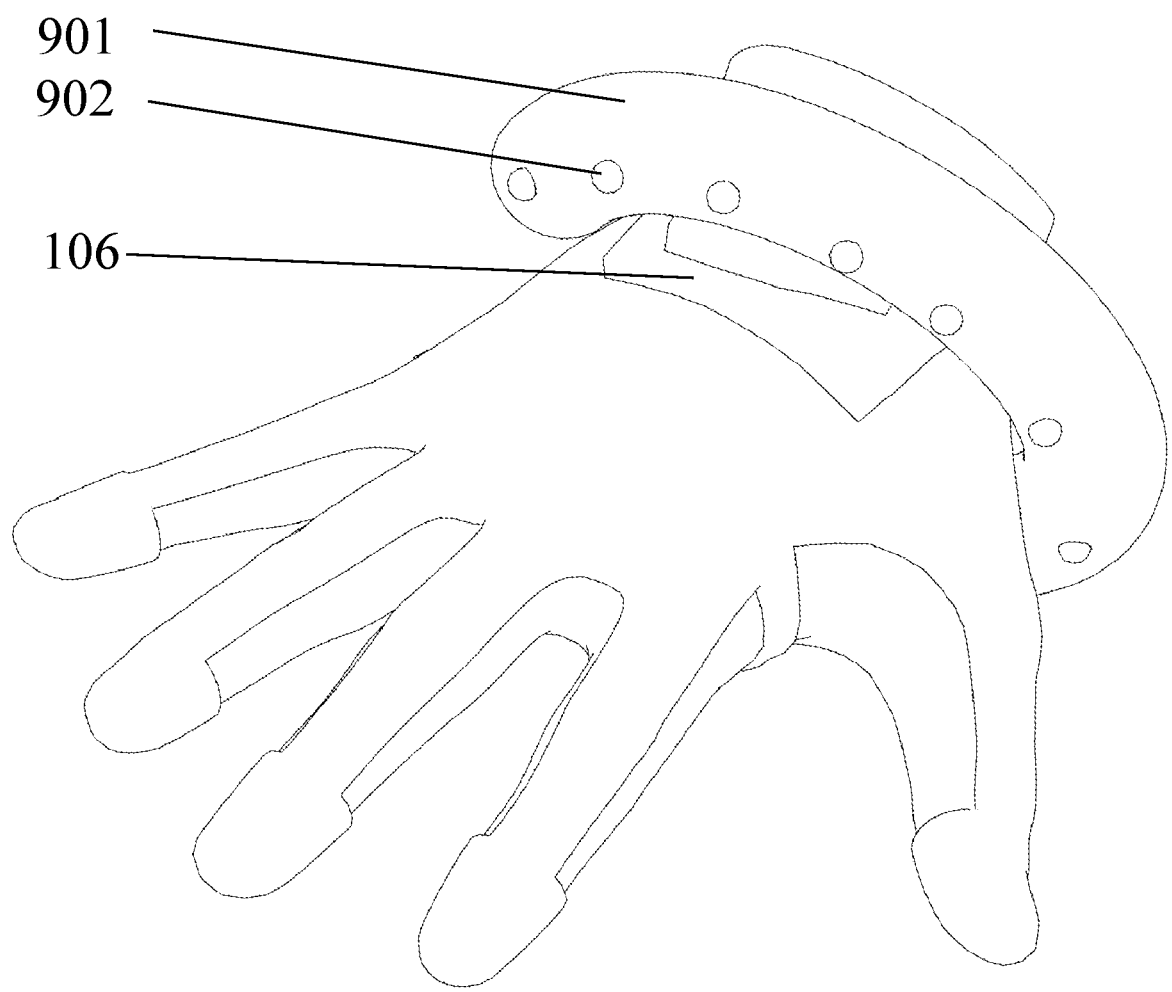
FIG. 9 shows a structure moungted on the device and embedded with tracking transceivers.

FIG. 9 shows a tracking structure 901 mounted onto the electronics module 106 and electrically connected to the electronics module 106 via the electrical contacts 107. The tracking structure 901 passes partially or fully around the wrist and houses multiple tracking modules 902, for example implemented TS3633-CM1 provided by Triad Semiconductor.

These receivers 902 provide the three dimensional position of the hand relative to an external frame of reference. In an alternative embodiment, the tracking modules 902 are realised as light emitting diodes and tracked by a camera external to the device, again for the purposes of 3d tracking.

I claim:

1. A wearable device for measuring one or more joint angles of a body of a user comprising:
a flexible, elastic substrate, the substrate attachable to the body;
a plurality of stretchable conductive loops attached to the substrate, a first group of the plurality of conductive loops positioned over distal interphalangeal joints when the substrate is worn on the body, a second group of the plurality of the conductive loops positioned over proximal interphalangeal joints when the substrate is worn on the body, and a third group of the plurality of conductive loops positioned on top of the metacarpal phalangeal joints, each of the plurality of conductive loops comprising a pattern of conductive material configured to stretch and increase inductance when the joint flexes and contract and decrease inductance when the joint extends;
a plurality of permanent magnets in proximity to a fourth group of the plurality of conductive loops, wherein the fourth group conductive loops each wrap around a permanent magnet;
current driving circuitry attached to the fourth group of the conductive loops and configured to generate a current in the fourth group of conductive loops and generate a force on the magnets;
another group of conductive loops attached to the substrate, wherein the another group of conductive loops are positioned on the substrate such that when a thumb carpal metacarpal joint flexes the another group of conductive loops change inductance due to the twisting and bending motion imparted to the substrate between the thumb and a back of a hand of the body;
a plurality of inductance measurement circuits attached to the plurality of conductive loops by conductive wires within or upon the substrate, the inductance measurement circuits configured to measure inductance in the corresponding conductive loops, wherein each of the plurality of inductance measurement circuits comprise a frequency counter; and a processor attached to the inductance measuring circuits, the processor configured to receive inductance values from the inductance measuring circuits and compute a plurality of joint angles based on the inductance values, the processor being connected to each frequency counter of the plurality of inductance measurement circuits.

2. The wearable device of claim 1, wherein said stretchable conductive loops comprise zigzag patterns, wherein the zigzag patterns accommodate movement of the conductive loops relative to movement of the joint.

3. The wearable device of claim 2, wherein the wearable device is attached to the body.

4. The wearable device of claim 3, wherein the plurality of conductive loops are positioned over a plurality of joints, when the substrate is worn on the body.

5. The wearable device of claim 4, further comprising at least two extensible conductive loops positioned opposite the primary direction of joint flexion of the metacarpal phalangeal joints of the digits and configured to measure abduction and flexion.

6. The wearable device of claim 3, further comprising a device attached to the wearable device at the wrist, the device comprising a plurality of optical or magnetic transmitters or receivers, the device configured to interoperate with a body tracking system.

7. The wearable device of claim 1, wherein said conductive loops comprise a plurality of turns, such that a circuit is formed from said inductance measuring circuits, through said conductive wires within or upon said substrate, through each loop in turn, and then back through said conductive wires to return to said inductance measuring circuit.

8. The wearable device of claim 1, wherein said conductive loops are positioned adjacent to the axis of flexion of the corresponding joint, when the substrate is worn on the body.

9. The wearable device of claim 1, wherein the wearable device comprises tubular structures configured to allow attachment to the body by allowing body parts to pass through the tubular structures.

10. The wearable device of claim 1, wherein the flexible, elastic substrate is a silicone or polyurethane elastomer or a woven elastic textile.

11. The wearable device of claim 1, wherein said processor is attached to a wireless transmitted configured to transmit information from said processor to a computer.

12. The wearable device of claim 1, wherein the amplifier, feedback circuit, and frequency counter are embodied in a field programmable gate array (FPGA).

13. The wearable device of claim 1, wherein each of the inductance measurement circuits comprises a means to generate an oscillatory current passing through said conductive loops and means to measure the frequency of the resulting oscillatory current.

14. The wearable device of claim 13, wherein said means to generate oscillatory current and measure the frequency of said oscillatory currents are embodied by digital logic gates.

15. The wearable device of claim 14, wherein said digital logic gates are embodied within a field programmable gate array (FPGA).

16. The wearable device of claim 1, wherein each of the inductance measurement circuits further comprise a capacitor, an amplifier, a feedback circuit, the amplifier and feedback circuit being connected to the corresponding conductive loop and capacitor and configured to generate an oscillatory signal, the capacitor being connected to two wires of the conductive wires, the feedback loop connected to one of the conductive wires, the amplifier being connected to the conductive wires, the frequency counter being connected to the feedback circuit and the amplifier.

17. A wearable device for measuring one or more joint angles of a body of a user comprising:
a flexible, elastic substrate, the substrate attachable to the body;
a plurality of stretchable conductive loops attached to the substrate, a first group of the plurality of conductive loops positioned over distal interphalangeal joints when the substrate is worn on the body, a second group of the plurality of the conductive loops positioned over proximal interphalangeal joints when the substrate is worn on the body, and a third group of the plurality of conductive loops positioned on top of the metacarpal phalangeal joints, each of the plurality of conductive loops comprising a pattern of conductive material configured to stretch and increase inductance when the joint flexes and contract and decrease inductance when the joint extends;
a plurality of permanent magnets in proximity to a fourth group of the plurality of conductive loops, wherein the fourth group conductive loops each wrap around a permanent magnet;
current driving circuitry attached to the fourth group of the conductive loops and configured to generate a current in the fourth group of conductive loops and generate a force on the magnets;
a plurality of inductance measurement circuits attached to the plurality of conductive loops by conductive wires within or upon the substrate, the inductance measurement circuits configured to measure inductance in the corresponding conductive loops, wherein each of the plurality of inductance measurement circuits comprise a capacitor, an amplifier, a feedback circuit, and a frequency counter, the amplifier and feedback circuit being connected to the corresponding conductive loop and capacitor and configured to generate an oscillatory signal, the capacitor being connected to two wires of the conductive wires, the feedback loop connected to one of the conductive wires, the amplifier being connected to the conductive wires, the frequency counter being connected to the feedback circuit and the amplifier; and
a processor attached to the inductance measuring circuits, the processor configured to receive inductance values from the inductance measuring circuits and compute a plurality of joint angles based on the inductance values, the processor being connected to each frequency counter of the plurality of inductance measurement circuits.

* * * * *